US006858107B2

(12) United States Patent
Ghyselen et al.

(10) Patent No.: US 6,858,107 B2
(45) Date of Patent: Feb. 22, 2005

(54) METHOD OF FABRICATING SUBSTRATES, IN PARTICULAR FOR OPTICS, ELECTRONICS OR OPTOELECTRONICS

(75) Inventors: Bruno Ghyselen, Seyssinet-Pariset (FR); Fabrice Letertre, Grenoble (FR)

(73) Assignee: S.O.I. Tec Silicon on Insulator Technologies S.A., Bernin (FR)

( * ) Notice: Subject to any disclaimer, the term of this patent is extended or adjusted under 35 U.S.C. 154(b) by 60 days.

(21) Appl. No.: 10/616,594

(22) Filed: Jul. 9, 2003

(65) Prior Publication Data

US 2004/0050483 A1 Mar. 18, 2004

Related U.S. Application Data

(60) Provisional application No. 60/461,504, filed on Apr. 9, 2003.

(30) Foreign Application Priority Data

Jul. 17, 2002 (FR) .............................. 02 09021

(51) Int. Cl.⁷ .............................. B32B 31/00
(52) U.S. Cl. ................. 156/250; 156/254; 156/247; 225/2; 125/23.01; 438/407; 438/977
(58) Field of Search ................ 156/250, 254, 156/247; 438/407, 977; 225/2; 125/23.01; 257/E21.567, E21.568

(56) References Cited

U.S. PATENT DOCUMENTS

| 3,901,423 A | * | 8/1975 | Hillberry et al. ............. 225/2 |
| 5,374,564 A | | 12/1994 | Bruel .......................... 437/24 |
| 5,559,043 A | * | 9/1996 | Bruel .......................... 438/407 |
| 5,877,070 A | | 3/1999 | Goesele et al. ............. 438/458 |
| 5,882,987 A | * | 3/1999 | Srikrishnan ................. 438/458 |
| 6,287,941 B1 | * | 9/2001 | Kang et al. ................. 438/459 |
| 6,306,730 B2 | * | 10/2001 | Mitani et al. ............... 438/458 |
| 6,429,104 B1 | | 8/2002 | Auberton-Herve .......... 438/527 |
| 6,436,614 B1 | * | 8/2002 | Zhou et al. ................. 430/321 |
| 6,790,747 B2 | * | 9/2004 | Henley et al. .............. 438/458 |
| 2001/0007789 A1 | * | 7/2001 | Aspar et al. ................ 438/458 |
| 2004/0055634 A1 | * | 3/2004 | Yamaguchi ................. 136/252 |

FOREIGN PATENT DOCUMENTS

| EP | 0 610 563 A2 | 8/1994 |
| FR | 2 681 472 | 3/1993 |
| FR | 2 774 510 | 8/1999 |
| JP | 10093122 | 4/1998 |
| WO | WO 99/41779 | 8/1999 |
| WO | WO 00/61841 | 10/2000 |
| WO | WO 01/75196 | 10/2001 |

OTHER PUBLICATIONS

M.K. Weldon, et al.—Mechanism of Silicon Exfoliation by Hydrogen Implantation and He, Li and Si Co-implantation—IEEE International SOI Conference, Oct. 1997.

* cited by examiner

*Primary Examiner*—Mark A. Osele
(74) *Attorney, Agent, or Firm*—Winston & Strawn LLP

(57) ABSTRACT

A method of fabricating substrates while minimizing loss of starting material of an ingot, wherein a layer is transferred onto a support. The technique includes forming a flat front face on a raw ingot of material, implanting atomic species through the front face to a controlled mean implantation depth to create a zone of weakness that defines a top layer of the ingot, bonding a support to the front face of the ingot, wherein the support has a surface area that is smaller than a surface area of the front face of the ingot, and detaching from the ingot at the zone of weakness that portion of the top layer that is bonded to the support to form the substrate.

23 Claims, 2 Drawing Sheets

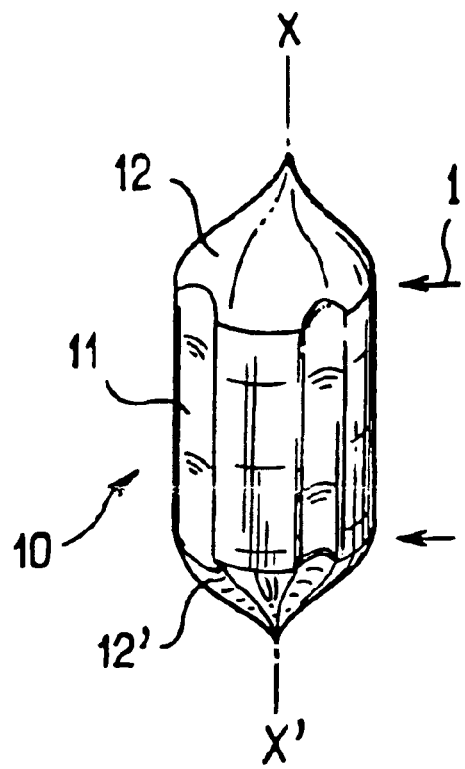
FIG_1
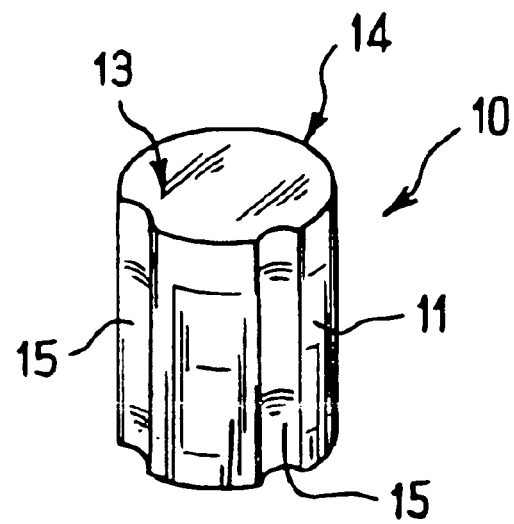
FIG_2
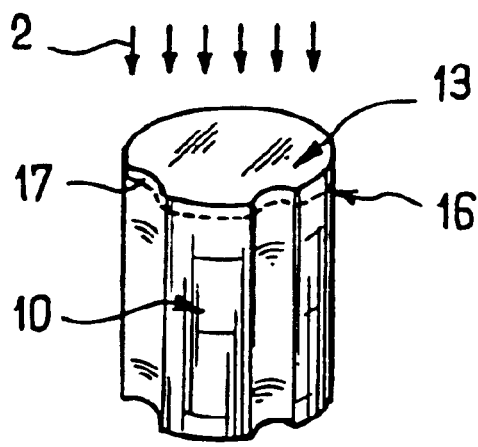
FIG_3
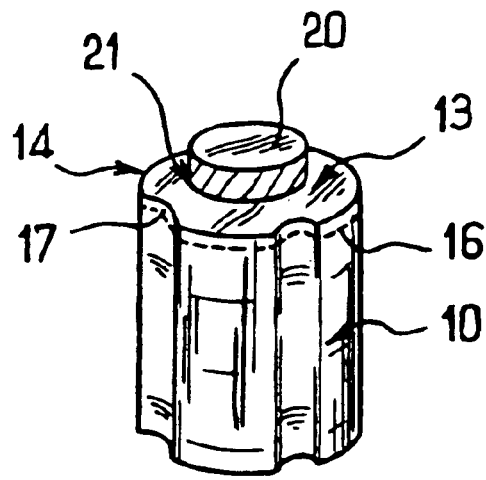
FIG_4

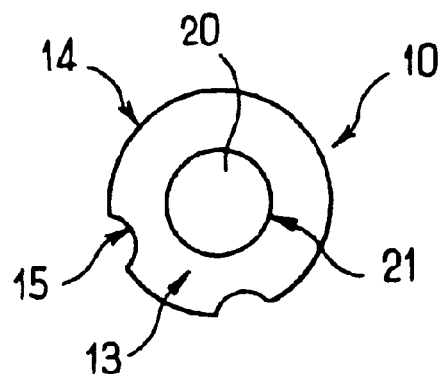
FIG_5
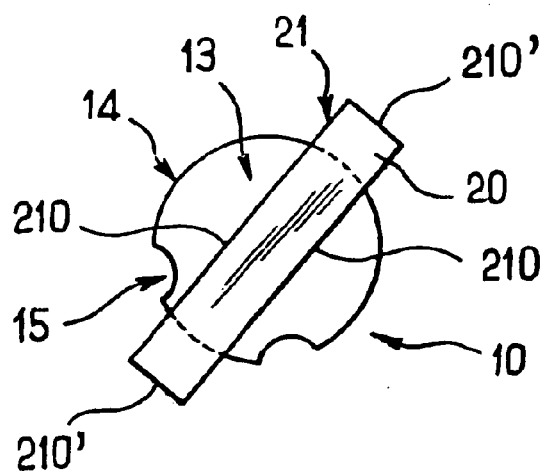
FIG_6
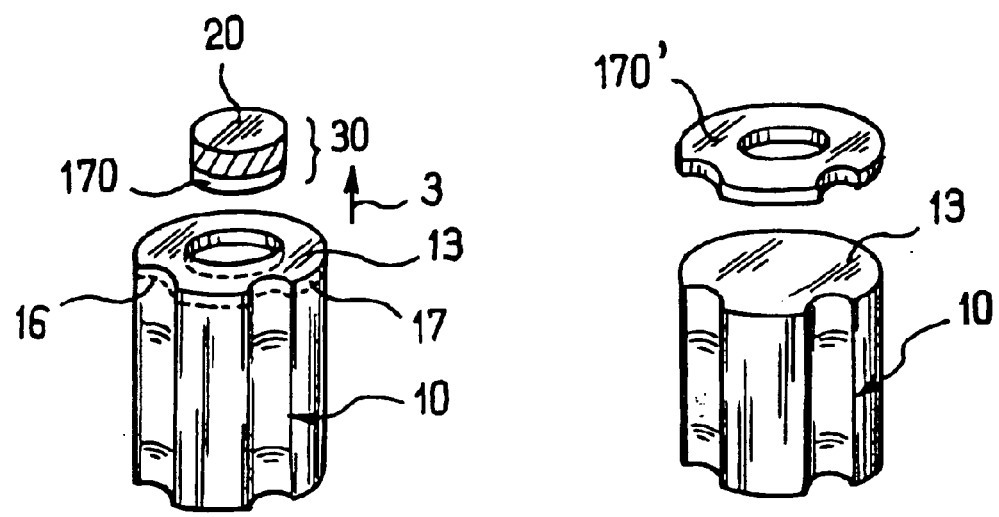
FIG_7          FIG_8

METHOD OF FABRICATING SUBSTRATES, IN PARTICULAR FOR OPTICS, ELECTRONICS OR OPTOELECTRONICS

This application claims the benefit of U.S. Provisional Application No. 60/461,504 filed on Apr. 9, 2003.

BACKGROUND ART

The invention relates to a method of fabricating substrates, in particular for optics, electronics or optoelectronics.

The starting materials used in fabricating the substrates can be obtained industrially, for example in the form of ingots of raw material.

In the case of monocrystalline silicon, for example, those ingots are obtained using the CZOCHALSKI pulling (CZ pulling) method from a bath of fused silicon or using a zone melting (ZM pulling) method from a polycrystalline ingot.

Monocrystalline silicon carbide is fabricated, for example, by means of a sublimation method that is well known to the skilled person.

Such growth methods produce ingots that are generally cylindrical in shape with two substantially conical ends. Depending on the nature of the material constituting the ingot, it may be from about ten centimeters long (for silicon carbide, for example) up to about 2 meters long (for silicon).

The ingots are then cut into slices perpendicular to the longitudinal axis of the cylinder to form later wafers of starting material that are then used in a variety of applications. The wafers are only a few hundred micrometers ($\mu$m) thick (as an example, 200 millimeter (mm) diameter silicon wafers of standard fabrication are 725 $\mu$m thick).

The steps for fabricating such wafers typically consist of trimming the two pointed ends of the ingot, and then grinding and turning its irregular lateral surface to obtain a cylinder of perfectly circular cross section. Next, the ingot is cut into slices using, for example, a circular saw or a wire saw.

The rondelles or slices obtained then undergo finishing, which includes grinding them to obtain a wafer with a uniform thickness, and then polishing at least one of its two opposite faces to obtain a perfectly flat surface. Finally, each wafer is immersed in a series of chemical baths to eliminate the dust and particles that may still subsist on the two faces and which could be a source of subsequent pollution.

The above-mentioned steps are extremely expensive both as regards the cost of the equipment used to carry out the machining or treatments, and as regards the time taken to execute and the loss of starting material on cutting. For example, when a 300 $\mu$m thick wafer is to be produced, about 400 $\mu$m of material is lost in forming that wafer. Thus, for an ingot length of 1 cm, i.e., 10000 $\mu$m, it is only possible to produce fourteen wafers (fourteen times 700 $\mu$m).

Further, with certain extremely hard, fragile and brittle materials such as silicon carbide, the above-mentioned preparation steps can prove to be extremely long and tedious as the product takes a long time to polish and chemical attack is difficult.

Moreover, sometimes the massive wafers obtained merely constitute an intermediate product. In certain methods of removing and transferring thin layers, for example a method such as that described in U.S. Pat. No. 5,374,564, only the front face of the wafer acts as a base for removing material and thus only the front face must be rigorously flat. In contrast, it is pointless to subject the rear face of the wafer and the cylindrical lateral face to polishing and finishing that is expensive both as regards time and starting material.

The goal of the invention is to overcome the disadvantages described above and, in particular, to substantially reduce the loss of starting material from the materials used in producing the substrates, in order to reduce fabrication costs.

The invention also aims to simplify and limit the machining steps carried out on the starting ingot to as great an extent as possible.

SUMMARY OF THE INVENTION

A method is provided for fabricating substrates while minimizing loss of starting material of an ingot, wherein a layer is transferred onto a support. The technique includes forming a flat front face on a raw ingot of material, implanting atomic species through the front face to a controlled mean implantation depth to create a zone of weakness that defines a top layer of the ingot, bonding a support to the front face of the ingot, wherein the support has a surface area that is smaller than a surface area of the front face of the ingot, and detaching from the ingot at the zone of weakness that portion of the top layer that is bonded to the support to form the substrate.

The method according to the invention may include one or more of the following features. The technique may include repeating the implanting, bonding and detaching steps at least once. The front face of the ingot has an outline, and the surface area of the support that is bonded to the front face of the ingot has an outline that is positioned within the outline of the front face of the ingot, so that lateral surface(s) of the ingot do not require lapping.

The method may further include forming a new flat front face on the ingot after detachment of portions of the top layer. The forming step may include eliminating residue(s) of an undetached top layer to obtain a new front face that can be bonded to a new support. The front face forming step may include an operation for cutting and lapping the front face of the ingot.

The implantation step may be conducted using sufficiently high energy so that the detached portion has a sufficient thickness to be free-standing. The support may comprise at least one layer of a monocrystalline or polycrystalline material selected from silicon, silicon carbide, indium phosphide, gallium arsenide and germanium. The support may be constituted by a plastic, flexible material. The support may be a gripping tool for transferring the detached portion.

Bonding of the support to the front face of the ingot may be accomplished by applying electrostatic forces, or may be accomplished by applying a pressure differential. The support may be bonded by molecular bonding, or may be bonded by eutectic bonding, or may be bonded by applying an adhesive, or may be bonded by applying a wax. The support may be permanently bonded, or may be temporarily bonded.

Detaching the layer of material from the remainder of the ingot may be carried out using at least one of applying mechanical stresses, applying electrical stresses, supplying heat energy, and using a chemical etching operation. The material of the ingot may be monocrystalline selected from silicon carbide, silicon, indium phosphide, gallium arsenide, and germanium. At least one of the support and the ingot may include(s) a layer of an insulator, and the insulator layer may be an oxide or a nitride. The raw ingot may be cut into at least one thick segment when the front face is formed.

The invention relates to a method of fabricating a substrate. Throughout the remainder of the description, the term "substrate" means an assembly generally comprising a support covered with a layer of a material originating from an ingot. The support may be temporarily or permanently bonded to the layer of material.

Concerning the composition of an ingot, the invention may be utilized with expensive materials such as monocrystalline materials, or with materials obtained by slowly pulling an ingot under optimal conditions for producing a low density of defects. The invention is also applicable to extremely hard materials for which machining and polishing are lengthy and difficult procedures.

For example, the technique according to the invention is particularly suitable for use with monocrystalline silicon carbide because of its hardness, and monocrystalline silicon, which is one of the most widely used materials in the micro-electronics field.

Regarding utilization of silicon, ingots may be obtained by CZ pulling (CZOCHALSKI) or by any other technique aimed at obtaining best quality monocrystalline silicon. For example, COPs type (Crystal Originated Particles) low defect density ingots, or those that are less sensitive to the formation of oxygen precipitates, may be used. FZ type ingots or other qualities of silicon corresponding to "perfect silicon" type commercially available ingots are also suitable. It is also possible to use silicon ingots that have undergone treatment to reduce defect density, for example heat treatment in hydrogen, which is well known. Other examples of monocrystalline materials that can be transferred onto the support include indium phosphide, gallium arsenide and germanium.

The term "ingot" means a mass of raw material, and the general form or shape of the ingot may vary. The ingot may be generally cylindrical in shape with two substantially conical ends, or it may be elongate, or tubular. The ingot may have a non-circular cross section, for example square, hexagonal, or octagonal, with or without two pointed ends, or it may be broadly spherical (known to the skilled person as a "boule"), or it may even be in the form of a cube.

Further, it should be understood that the method of the invention is also applicable to thick segments taken from the ingot. When the ingot is elongate in shape, the thick segments can be cut substantially transversally or, in contrast, longitudinally.

The technique according to the invention eliminates the need to conduct the intermediate steps used to fabricate massive wafers, and thus eliminates the associated loss of material.

Other aspects, aims and advantages of the invention become clear on reading the following detailed description.

BRIEF DESCRIPTION OF THE DRAWINGS

The invention will be better understood from the references made to the accompanying drawings, in which:

FIGS. 1, 2, 3, 4, 7 and 8 are simplified diagrams, not drawn to scale, of an ingot illustrating the different steps employed in an implementation of the method of fabricating substrates to minimize the loss of starting material according to the invention;

FIGS. 5 and 6 are simplified top views of an ingot and bonded support that illustrate how supports having different outlines can be used in implementations according to the invention.

DETAILED DESCRIPTION OF THE PREFERRED EMBODIMENTS

As can be seen in FIG. 1, the starting product is an ingot 10 approximately in the shape of a cylinder with an axis of revolution X–X'. The lateral surface 11 of the ingot is typically not geometrically regular. In particular, top and bottom end regions 12 and 12' (relative to said axis X–X') are not flat and may even be conical.

As shown in FIG. 2, one of the end regions 12 may undergo treatment for forming a flat face 13 termed the "front face". This treatment consists firstly in sawing or cutting the end 12, then in lapping and polishing the flat face 13 (see general reference number 1 in FIG. 1).

Advantageously, before or after the step of polishing face 13, it is possible for the face to undergo chemical etching treatment to eliminate the zone that has been damaged during the mechanical material removal steps. It should be noted, however, that it is not necessary to machine the bottom end 12' to implement the invention.

As shown in FIG. 2, an ingot 10 is obtained that has the flat face 13 on a plane that is substantially perpendicular to axis X–X' of the ingot, although this is not obligatory. The ingot has an outline 14 that is generally irregular. Ingot 10 can, for example, have defects 15 on its lateral surface. Further, depending on the method used for fabricating ingot 10, it may have a useful central core, for example monocrystalline in nature, surrounded laterally by a gangue of unusable polycrystalline material that is about 1 mm to 2 mm thick.

By means of the method of the invention, no more—or substantially no more—lapping of the lateral surface 11 or of the polycrystalline gangue is carried out before transferring the layer. The expression "substantially no more" means that it is possible to carry out a very small amount of lapping of the lateral surface 11 but with tolerances in the diameter that are much higher than those normally tolerated during wafer production.

By way of illustrative example, a 50 mm diameter silicon carbide ingot may measure no more than 10 centimeters (cm) in length, while a 200 mm diameter silicon ingot can be as much as 1.50 meters (m) to 2 m long.

As a result, after the machining operations (trimming the tip 12 and polishing the front face 13), a silicon carbide ingot will generally be used as such in the method according to the invention, while a silicon ingot will advantageously be cut into segments about 5 cm to 50 cm in length to facilitate handling. Nevertheless, cutting off the segments (termed "thick segments" in the remainder of the description) results in proportionally low material losses that are not on the same scale as the material losses caused in the prior art during fabrication of wafers that are only a few hundreds of micrometers thick.

Referring to FIG. 3, an operation 2 for implanting atomic species (typically hydrogen gas ions or a mixture of hydrogen and helium gas ions) is next carried out on the front face 13 of the ingot. This operation creates a zone of weakness 16 in the material so that the top layer 17 of the ingot can subsequently be detached from the remainder of the ingot 10. The top layer extends between the zone of weakness 16 and the front face 13 of the ingot.

The term "implanting atomic species" means any bombardment of atomic, molecular or ionic species, which is capable of introducing the species into a material with a maximum concentration of the species at a predetermined depth with respect to the bombarded surface. The species are introduced into the material with an energy that is also distributed about a maximum. Implantation can be carried out using an ion beam implanter, a plasma immersion implanter, and the like.

Implantation doses are advantageously of the order of $10^{16}$ to $10^{18}$ ions/cm$^2$. Implantation energies can advantageously vary from a few tens of keV to at most one MeV. Such implantation energies result in an implantation depth, and thus in a thickness of the top layer 17, which can be from a few tenths to a few tens of micrometers.

High energy implantation (of the order of at least 1 megaelectronvolt (MeV) can produce a layer 17 with a thickness of at least 50 µm, sufficient for it to then be free-standing. Conversely, low energy implantation (i.e., less than 1 MeV) produces a thinner top layer 17 which must be permanently attached to a support.

The implantation conditions will be selected by the skilled person as a function of the nature of the material and the envisaged applications. In general, the manner by which subsequent detachment along the zone of weakness 16 can be achieved with a minimum of effort is also considered.

FIG. 4 shows a support 20 that is bonded to the front surface 13 of ingot 10. The support 20 can comprise a single layer of material or, in contrast, a plurality of superimposed layers. Examples may include monocrystalline or polycrystalline materials such as silicon, silicon carbide (SiC), indium phosphide (InP), gallium arsenide (AsGa) and germanium (Ge). Support 20 can also comprise an insulating layer such as a layer of oxide (for example $SiO_2$) or nitride (for example $Si_3N_4$). Support 20 can also be a gripping tool of the type comprising a boss with a particular shape that is known to the skilled person. Finally, the support 20 can be constituted by a plastic and/or flexible material such as a strip of plastic material or polymer or a strip of paper.

The thickness of the support is advantageously selected to allow an optional slight deformation by bending to facilitate its bonding to ingot 10. Further, its dimensions and shape will be selected as a function of the envisaged applications. In this particular case in which the ingot 10 has an unusable peripheral gangue, the dimensions of the support 20 will be selected so that only useful material at the center of the ingot is removed.

Bonding can be definitive or temporary depending on the final envisaged applications and on the nature and cost of the materials used for the support 20 or the ingot 10. The skilled person will select the most appropriate technique.

A variety of definitive bonding techniques is described below. Temporary bonding techniques are discussed below when describing the step for detaching support 20.

Bonding can be carried out by "direct bonding" or "molecular adhesion bonding", i.e., a technique that is known to the skilled person as "wafer bonding" or "direct bonding", in which no adhesive is used. Such techniques, however, require the surfaces which are to be brought into contact to be perfectly flat and polished.

That type of bonding is generally used in an extremely clean environment and thus is well suited for silicon ingots.

Bonding can also be accomplished by anodic bonding. That type of bonding is suitable for a silicon carbide type material as it does not require the degree of cleanliness of the surfaces and removal of the contaminants required of the direct bonding technique described above.

In a manner that is known to the skilled person, bonding can also be accomplished using an adhesive, a wax, or eutectic bonding.

Bonding can also be accomplished by applying or forming oxides (for example $SiO_2$) or nitrides (for example $Si_3N_4$) on the surfaces of the ingot 10 and/or the support 20 to be brought into contact. That type of bonding will be used when an insulating substrate is to be produced subsequently. In contrast, it is possible to use an intermediate bonding layer formed from a refractory material to obtain a substrate with a conductive nature.

These bonding techniques have been described in the document "Semiconductor Wafer Bonding", Science and Technology, by Q. Y. Tong and U. Göosele, Wiley Interscience Publications.

In accordance with a first variation shown in FIG. 5, the outline 21 of the face of the support 20 which comes into contact with the front face 13 of the ingot 10 is inscribed within the outline 14 of the front face 13. This circular support 20 could also be square, rectangular or of any shape provided that it is inscribed within the outline 14. Thus, it is not necessary to grind the ingot 10 to any particular diameter.

In a second variation shown in FIG. 6, only a portion of the outline 21 of the face of the support 20 which comes into contact with the front face 13 is inscribed within the outline 14 of the front face 13. As shown, this support 20 can be rectangular and its length may be greater than the diameter of the ingot 10. The outline 21 is divided into two portions, a first portion 210 of the outline which is inscribed within the outline 14 of the front face 13 of the ingot 10 (in this case two parallel lines) and a second portion 210' of the outline 21 which is located outside the outline 14 (in this case the two outside ends of the rectangular support 20).

FIG. 7 illustrates detaching a portion 170 of the top layer 17 of the ingot in the direction of arrow 3, wherein the layer 17 is bonded to the support 20. This operation is carried out by applying to the support 20 an action that can cause the portion 170 to detach at the zone of weakness 16. Detachment is accomplished by at least one of the following techniques that can be used alone or in combination: application of mechanical stresses (shear, tension, compression, ultrasound, moving the support away from the ingot, etc.), or stresses originating from electrical energy (application of an electrostatic or electromagnetic field), or supplying heat energy (radiation, convection, conduction, increasing the pressure in the microcavities), and the like. Heat energy can be derived from applying an electromagnetic field, an electron beam, thermoelectric heating, a cryogenic fluid, a supercooled liquid, and the like.

Detachment can also be accomplished by applying a chemical treatment such as a chemical etching operation. For example, in a manner that is known to the skilled person, an etching operation can be used that employs a chemical solution that attacks and specifically destroys the implanted zone.

Detachment can also be accomplished by combining a plurality of the detachment techniques mentioned above. FIG. 7 shows the portion 170 of the top layer 17 being removed from the ingot 10. As shown, the top layer 17 is automatically cut to size (i.e., self-defined) to the outline of the support 20 (circular in FIGS. 4 and 5). Consequently, there is no need to cut the lateral peripheral surface 11 of the ingot 10 to adapt it to the shape of the support 20, and thus the concomitant disadvantages of such a cutting operation described in the background section are avoided. A substrate 30 is obtained that includes the self-defined layer 170 bonded to the support 20.

In the frequent case in which the support 20 has a circular outline, the step of grinding the ingot "to diameter" is superfluous. Therefore, the present technique eliminates the step consisting of machining a perfectly cylindrical ingot.

As shown in FIG. 6, the support 20 may have an outline 21 that in part exceeds that of the ingot 10. In such a case, when the top layer of the ingot 10 is withdrawn from the remainder of the ingot it is automatically self-defined at portion 210 of the outline 21. As this portion 210 is inscribed within the outline 14, grinding the ingot to diameter is unnecessary in this case as well.

Some of the definitive bonding techniques mentioned above, such as wafer bonding, eutectic bonding, or adhesive or wax bonding can become temporary bonding techniques by applying a subsequent treatment (chemical treatment, heating, etc . . . ). Such techniques allow the support 20 to be detached from the layer 170, for example to transfer the latter to another support or substrate.

It should also be noted that when the support 20 is a gripping tool, bonding may be accomplished by applying a pressure differential (suction) or by using electrostatic forces. Such techniques are also temporary bonding techniques.

FIG. 8 illustrates a configuration wherein a ring of material 170' remains on the surface of the ingot 10 after the thin layer 170 has been removed by using the support 20. A simple finishing treatment can be used to eliminate the ring of material 170'. The term "ring" 170' should be considered in its broad sense as meaning any residue of the top layer 17 which remains after removing the thin layer 170, this ring may possibly be any non-annular shape and it can also be in the form of a simple blistered film.

Depending on the implantation energy of the atomic species and thus on the thickness of the thin layer 170 and the ring 170', the finishing treatment can be carried out by light polishing, simple brushing, or by applying heat energy. The finishing step is intended to render the front face 13 capable of being bonded to a new support 20. It should be noted, however, that such a finishing step may not always be necessary and the skilled person may elect to carry it out systematically or otherwise before recommencing a cycle of the layer-removal steps.

The steps described above and illustrated in FIGS. 3, 4, 7, and optionally that described with respect to FIG. 8, can be repeated several times if desired until the ingot 10 is exhausted.

Some examples of implementations of the method of the invention are described below. However, the invention is not limited to these examples. It is generally applicable to ingots of materials used to produce substrates in the optics, electronics and optoelectronics fields, in particular semiconductor materials.

EXAMPLE 1

A monocrystalline silicon carbide ingot 10 was used. Its periphery had a polycrystalline gangue inherent to the growth method employed. The ingot had a diameter of about 60 mm and a length on the order of 50 mm. Depending on the envisaged applications, the ingot could be of polytype 4H or 6H, using the denominations employed by the skilled person.

The ingot underwent cutting and lapping operations to result in an ingot as illustrated in FIG. 2, and a polishing finishing step was used. Preferably, prior to the polishing finishing step, a chemical attack step was carried out to remove a zone damaged during the mechanical material removal steps. Typically, 10 $\mu$m of material was removed during this chemical attack step.

Depending on the polytype, the surface 13 of the ingot will be selected to be substantially parallel to a crystallographic plane (polytype 6H, on-axis) or deliberately out of orientation by a few degrees (as is routine in the case of polytype 4H, for example by 8°, termed "8° off-axis"). This implies employing an operation for determining the corresponding crystallographic planes.

Referring to FIG. 3, an implanting step 2 for implanting atomic species was then carried out. In this example, the atomic species were H$^+$ ions. They were implanted with an energy of 200 kiloelectronvolts (keV) to define a top layer 17 that was more than 1 $\mu$m thick. An implantation dose of the order of $8 \times 10^{16}$ H$^+$/cm$^2$ was used.

As shown in FIG. 4, a polycrystalline silicon carbide support 20 obtained by CVD (chemical vapor decomposition) with a thickness of 200 $\mu$m coated with a 1 $\mu$m thick layer of SiO$_2$ was bonded to the front surface 13 of the ingot, such that the SiO$_2$ layer contacted the ingot. This support was 50 mm in diameter and was positioned substantially centrally with respect to the front face 13.

Bonding was carried out by direct bonding or wafer bonding (see the above-cited book by Gösele). Advantageously, just prior to bonding, each of the surfaces to be brought into contact was cleaned and slightly polished. The cleaning and polishing operation removed a thickness of only a few tenths of a nanometer during polishing.

A detachment operation was conducted at 900° C. for 2 hours along the zone of weakness 16. During detachment, a disk 170 with a diameter that substantially corresponded to the diameter of the support 20 (i.e., about 50 mm) was removed from ingot 10 and transferred to the support. There remained on ingot 10 a complementary annular ring 170', as shown in FIG. 7, with a width of about 5 mm.

The assembly constituted by support 20, the layer 170 of monocrystalline SiC removed from ingot 10, and the intermediate layer of SiO$_2$ then underwent a series of finishing steps. These were carried out with the manifold aim of regaining the roughness and layer qualities of the monocrystalline SiC layer of a monocrystalline substrate, but also to strengthen the bonding interface. The finishing steps may include heat treatments, which were oxidizing or non-oxidizing, chemical etching steps and finishing polishing steps.

Further, as shown in FIG. 8, the ingot 10 then underwent a finishing step to remove the residue 170' resulting in an ingot that is similar to that of FIG. 2, with the exception that it is a little shorter. The finishing steps could comprise heat treatment steps, chemical etching steps and polishing steps. In the case, for example, in which polishing is the finishing step, it should be noted that the material removed during the finishing polishing is significantly less than that of the lapping and polishing steps used during preliminary preparation of the ingot with a view to preparing the surface 13 for the first removal of the layer, using the method described above. If the removed thickness is of the order of 1.5 $\mu$m, a finishing step corresponding to removing 3 $\mu$m of material will be amply sufficient.

The different steps of the method just described were then repeated a large number of times. The theoretical limit to the number of removal steps corresponds to the complete exhaustion of the entire mass of ingot 10. In practice, this cycle will be stopped before the remaining thickness becomes too short, because at some point there is no longer a guarantee that the remainder of the ingot is rigid. Thicknesses less than 200 $\mu$m are reasonable limits in this respect.

EXAMPLE 2

This example reproduced Example 1, but differed in that the ingot 10 was an ingot of monocrystalline silicon. This ingot had a diameter of slightly more than 300 mm, or about 310 mm, a <100> crystallographic orientation and a length of 1.20 m, ignoring the conical ends. It could be obtained using any known technique such as CZ (CZOCHALSKI) pulling.

As shown in FIG. 2, this ingot 10 also underwent a cutting operation aimed at removing the conical ends 12, 12'. The ingot also underwent a turning operation to form a circular cylinder with a diameter of about 300 mm, with a diameter tolerance that was greater than the normal standards fixing tolerances for the diameter of substrates. A diameter of 302 mm±1 mm, and thus slightly irregular, was obtained.

In contrast to the preceding example, this ingot 10 underwent segmenting to define six segments of ingot each with a length of the order of 20 cm. Each ingot segment was then lapped, and its ends were polished to obtain six segments that were equivalent to that of FIG. 2. Finally, a chemical etching step was interposed just prior to final polishing with the aim of removing 80 μm of silicon that could correspond to a zone damaged by lapping or cutting.

Again, implantation was carried out with $H^+$ions at an energy of 200 keV to define a 1.5 μm thick top layer 17. An implantation dose of the order of $8 \times 10^{16}$ $H^+$/cm was used.

Support 20 in this example was a 300 mm CZ type silicon substrate thermally oxidized on its surface to form a 0.4 μm thick oxide layer. The thermal oxide was used to produce a silicon on insulator structure ("SOI" type structure).

Bonding was by direct bonding or wafer bonding (see the above-cited book by Gösele). Just prior to bonding, each of the surfaces that was to be brought into contact was cleaned using one of the techniques known to the skilled person.

Detachment along the implanted zone was accomplished by applying a heat treatment carried out at 500° C. for 2 hours. During detachment, a disk the diameter of which substantially corresponded to the diameter of the support (i.e., about 300 mm) was removed from the ingot and transferred to the support 20. A complementary ring then remained on the ingot as shown in FIG. 7, of the order of a few millimeters wide depending on the exact diameter of the ingot and the more or less rounded shape of the edges of support 20.

A 300 mm diameter SOI type structure was obtained having a silicon thickness of 1.5 μm over a thickness of 0.4 μm of insulator in the form of $SiO_2$.

In order to increase productivity, applying this method to both ends of the segment was envisaged. Each of the two ends was successively or concomitantly implanted, bonded to a support substrate 20 and underwent a detachment and finishing step for each new cycle.

EXAMPLE 3

Example 3 reproduces Example 2 but the ingot 10 was cut into twenty-four segments each with a thickness of the order of 50 mm.

In this example, the loss of material linked to the cutting, grinding and polishing operations was higher than in Example 2 in which only six segments were cut. In contrast, more segments were obtained on which it was possible to operate in parallel.

EXAMPLE 4

This example reproduced Example 3 but differed in that the support 20 acted as a temporary support. In Example 3, the support 20 was permanently and definitively bonded.

For implantation, $H^+$type atomic species were used. The implantation parameters were an energy of 500 keV and a dose of $1.2 \times 10^{17}$ $H^+$/cm². Under these conditions, the thickness of the removed layer 17 was about 4 μm to 5 μm.

The support 20 was constituted by a 300 mm diameter CZ silicon wafer coated with a layer of thermal oxide, and bonding between the support 20 and the front face 13 of the ingot 10 was accomplished by dint of a reversible adhesive or a reversible wax with a relatively low melting temperature. Typically, a wax with a melting temperature in the range 70° C. to 120° C. was used. Such waxes are known to the skilled person.

Detachment differed in this example in that it was carried out at ambient temperature by applying mechanical forces aimed at spacing the support substrate 20 from the remainder of the ingot. Thus, forced detachment wascarried out along the interface that had been weakened by implantation. One means of applying these mechanical stresses consisted, for example, of inserting a blade or a jet of air or pressurized water into the gap formed at the junction between the face 13 and support 20.

Advantageously, an initial heat treatment could have been carried out prior to applying the wax with the aim of encouraging the weakened state, in particular by the growth of micro-cavities in the implanted zone 16. A temperature of the order of 450° C. is recommended.

After detachment, the layer 17 bonded to the support 20 by the wax layer was brought into intimate contact using a direct bonding technique with, for example, a second 300 mm diameter support formed from silicon. This second bonding could be encouraged by light polishing, typically removing 0.1 μm of the layer 17 after the detachment step (illustrated in FIG. 7) and prior to contact with the second support which could itself be definitive.

Finally, the layer 17 was released from the support 20 by means of a heat treatment at a temperature that exceeded the melting temperature of the wax. Cleaning using solvents could then be carried out to remove any wax residue remaining on the layer 17.

EXAMPLE 5

Example 5 reproduces Example 2 and the implantation parameters of Example 4 with the following differences.

The goal in this case was to produce strips of monocrystalline silicon at least 50 cm long transferred to plastic strips of the order of 5 cm wide. To this end, the silicon ingot was cut longitudinally parallel to the X–X' axis, and lapped along this plane into a plurality of slabs. The slabs were in the form of rectangular parallelepipeds having a length of the order of 1.20 m, a thickness of the order of 1 cm and a width varying from about 305 mm to about 100 mm depending on whether the slabs were removed from the,core of the ingot (close to the X–X' axis) or from the edges of the ingot. Each of these slabs was implanted under conditions similar to Example 4 and underwent an annealing treatment at about 450° C.

Bonding was accomplished by applying an adhesive strip constituted by a plastic support strip onto which an adhesive had been spread.

Detachment was carried out by tearing the adhesive strip from the slab resulting from the ingot. For the same slab and in a single implantation step, it was then possible to remove a plurality of strip sections the width of which was defined by the width of the applied adhesive strip by juxtaposing a plurality of pieces of adhesive strip onto said wafer.

EXAMPLE 6

Example 6 reproduces Example 3 with the following differences.

The goal was to produce a finished substrate comprising a definitive plastic support 10 mm in diameter onto which a plurality of silicon chips have been transferred, each being hexagonal in shape. A large quantity of such hexagons could be inscribed on the surface of a silicon ingot, depending on the diameter of the ingot, which can be 100 mm, 125 mm, 150 mm, 200 mm or even 300 mm.

The silicon ingot 10 considered here had a diameter of 100 mm.

After implanting the front face 13 of the ingot, and heat treatment carried out at 450° C., a temporary support 20 is applied to the face 13. The temporary support 20 was a tool provided with a hexagonal boss and a suction device that could create an underpressure at the boss to establish a temporary bond between the boss and a portion of the surface 13 of the ingot. This bond was temporary in that it could be interrupted by stopping the suction.

After starting the suction, the tool could remove a hexagonal silicon chip from the ingot by tearing. The tool could then transport the silicon hexagon and bring it into contact with the definitive support formed from plastic, already coated with adhesive for final assembly. Finally, the suction bond between the tool and the silicon hexagon was released.

The hexagon removal operation could then be repeated a plurality of times from face 13 of the ingot prior to having to finish the face of said ingot, for example by polishing. To this end, the dimensions of the hexagonal boss were such that it could advantageously remove a plurality of hexagonal chips side by side from each layer 17.

What is claimed is:

1. A method of fabricating substrates while minimizing loss of starting material of an ingot, wherein a layer is transferred onto a support, comprising:

forming a flat front face on a raw ingot of material;

implanting atomic species through the front face to a controlled mean implantation depth to create a zone of weakness that defines a top layer of the ingot;

bonding a support to the front face of the ingot, wherein the support has a surface area that is smaller than a surface area of the front face of the ingot; and detaching from the ingot at the zone of weakness that portion of the top layer that is bonded to the support to form the substrate.

2. The method according to claim 1 which further comprises repeating the implanting, bonding and detaching steps at least once.

3. The method according to claim 1 wherein the front face of the ingot has an outline and the surface area of the support that is bonded to the front face of the ingot has an outline that is positioned within the outline of the front face of the ingot, so that lateral surface(s) of the ingot do not require lapping.

4. The method according to claim 1 further comprising forming a new flat front face on the ingot after detachment of portions of the top layer.

5. The method according to claim 4 wherein the forming step includes eliminating residue(s) of an undetached top layer to obtain a new front face that can be bonded to a new support.

6. The method according to claim 1 wherein the front face forming step includes an operation for cutting and lapping the front face of the ingot.

7. The method according to claim 1 wherein the implantation step is conducted using sufficiently high energy so that the detached portion has a sufficient thickness to be free-standing.

8. The method according to claim 1 wherein the support comprises at least one layer of a monocrystalline or polycrystalline material selected from silicon, silicon carbide, indium phosphide, gallium arsenide and germanium.

9. The method according to claim 1 wherein the support is constituted by a plastic, flexible material.

10. The method according to claim 1 wherein the support is a gripping tool for transferring the detached portion.

11. The method according to claim 10 wherein the bonding is accomplished by applying electrostatic forces.

12. The method according to claim 10 wherein the bonding is accomplished by applying a pressure differential.

13. The method according to claim 1 wherein the support is bonded by molecular bonding.

14. The method according to claim 1 wherein the support is bonded by eutectic bonding.

15. The method according to claim 1 wherein the support is bonded by applying an adhesive.

16. The method according to claim 1 wherein the support is bonded by applying a wax.

17. The method according to claim 1 wherein the support is permanently bonded.

18. The method according to claim 1 wherein the support is temporarily bonded.

19. The method according to claim 1 wherein detaching the layer of material from the remainder of the ingot is carried out using at least one of applying mechanical stresses, applying electrical stresses, supplying heat energy, and using a chemical etching operation.

20. The method according to claim 1 wherein the material of the ingot is monocrystalline and is selected from silicon carbide, silicon, indium phosphide, gallium arsenide, and germanium.

21. The method according to claim 1 wherein at least one of the support and the ingot include(s) a layer of an insulator.

22. The method according to claim 21 wherein the insulator layer comprises an oxide or a nitride.

23. The method according to claim 1 wherein the raw ingot is cut into at least one thick segment when the front face is formed.

* * * * *